United States Patent
Wang et al.

(10) Patent No.: US 11,341,039 B2
(45) Date of Patent: May 24, 2022

(54) DATA ARRANGEMENT METHOD OF FLASH MEMORY, FLASH MEMORY STORAGE DEVICE AND FLASH MEMORY CONTROL CIRCUIT UNIT

(71) Applicant: Hefei Core Storage Electronic Limited, Anhui Province (CN)

(72) Inventors: Zhi Wang, Anhui Province (CN); Yan Zheng, Anhui Province (CN); Xiaoyang Zhang, Anhui Province (CN); Kai-Di Zhu, Anhui Province (CN)

(73) Assignee: Hefei Core Storage Electronic Limited, Anhui (CN)

( * ) Notice: Subject to any disclaimer, the term of this patent is extended or adjusted under 35 U.S.C. 154(b) by 0 days.

(21) Appl. No.: 16/851,116

(22) Filed: Apr. 17, 2020

(65) Prior Publication Data

US 2021/0294737 A1 Sep. 23, 2021

(30) Foreign Application Priority Data

Mar. 19, 2020 (CN) .......................... 202010196343.5

(51) Int. Cl.
*G06F 12/02* (2006.01)
*G06F 12/0817* (2016.01)
*G11C 16/14* (2006.01)

(52) U.S. Cl.
CPC ...... *G06F 12/0246* (2013.01); *G06F 12/0253* (2013.01); *G06F 12/0822* (2013.01); *G11C 16/14* (2013.01); *G06F 2212/7209* (2013.01)

(58) Field of Classification Search
CPC ............... G06F 3/00; G06F 3/06–0689; G06F 12/00–16; G06F 1/00–3296;
(Continued)

(56) References Cited

U.S. PATENT DOCUMENTS 5,560,003 A * 9/1996 Nilsen ................. G06F 12/0253
5,819,304 A * 10/1998 Nilsen ................. G06F 12/0253
711/104
(Continued)

FOREIGN PATENT DOCUMENTS

CN 101171641 4/2008
CN 106326136 1/2017
(Continued)

OTHER PUBLICATIONS

J. Cui, Y. Zhang, J. Huang, W. Wu and J. Yang, "ShadowGC: Cooperative garbage collection with multi-level buffer for performance improvement in NAND flash-based SSDs," 2018 Design, Automation & Test in Europe Conference & Exhibition (DATE), 2018, pp. 1247-1252 (Year: 2018).*

(Continued)

*Primary Examiner* — Daniel C. Chappell
(74) *Attorney, Agent, or Firm* — JCIPRNET

(57) ABSTRACT

A data arrangement method of a flash memory, a flash memory storage device, and a flash memory control circuit unit are provided. The method may be applied to a flash memory, an embedded memory device, or a solid-state disk having a three-dimensional (3D) structure. The method includes: executing a background garbage collection operation in a background mode; receiving at least one write command from a host when the background garbage collection operation is not completed to suspend the background garbage collection operation and exit the background mode; executing the at least one write command; and entering the background mode and continuing the execution of the background garbage collection operation after the at least one write command is completed. Therefore, execution efficiency of the write command in a foreground mode may be optimized.

15 Claims, 8 Drawing Sheets

(58) Field of Classification Search
CPC ............ G06F 5/00–16; G06F 8/00–78; G06F 9/00–548; G06F 11/00–3696; G06F 13/00–4295; G06F 15/00–825; G06F 16/00–986; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G05B 13/00–048; G05B 15/00–02; G05B 17/00–02; G06K 9/00–6298; G06N 3/00–126; G06N 5/00–048; G06N 7/00–08; G06N 10/00; G06N 20/00–20; G06N 99/00–007; G11B 20/00–24; G11B 33/00–1493; G11C 7/00–24; G11C 11/00–5692; G11C 13/00–06; G11C 14/00–009; G11C 15/00–06; G11C 16/00–3495; G11C 17/00–18; G11C 2207/00–229; G11C 2216/00–30; H01L 25/00–50; H01L 27/00–3293; H01L 2225/00–1094; H04L 9/00–38; H04L 12/00–66; H04L 41/00–5096; H04L 49/00–9094; H04L 61/00–6095; H04L 67/00–42

See application file for complete search history.

(56) References Cited

U.S. PATENT DOCUMENTS

| | | | | |
|---|---|---|---|---|
| 5,943,692 | A * | 8/1999 | Marberg | G06F 12/0246 |
| | | | | 711/E12.008 |
| 2003/0126164 | A1* | 7/2003 | O'Connor | G06F 12/0253 |
| 2006/0184722 | A1* | 8/2006 | Sinclair | G06F 3/0607 |
| | | | | 711/E12.008 |
| 2008/0059747 | A1* | 3/2008 | Burckart | G06F 12/0253 |
| | | | | 711/170 |
| 2009/0157950 | A1* | 6/2009 | Selinger | G06F 12/08 |
| | | | | 711/E12.008 |
| 2010/0262766 | A1* | 10/2010 | Sprinkle | G06F 12/0246 |
| | | | | 711/E12.001 |
| 2012/0084489 | A1* | 4/2012 | Gorobets | G06F 12/0246 |
| | | | | 711/E12.001 |
| 2015/0081996 | A1 | 3/2015 | Flood | |
| 2015/0261452 | A1 | 9/2015 | Moon et al. | |
| 2018/0024920 | A1 | 1/2018 | Thomas et al. | |
| 2018/0196622 | A1* | 7/2018 | Oshimi | G06F 12/0246 |
| 2019/0050312 | A1* | 2/2019 | Li | G11C 16/10 |
| 2019/0243567 | A1* | 8/2019 | Kankani | G06F 3/0616 |
| 2019/0278490 | A1 | 9/2019 | Muchherla et al. | |
| 2020/0026465 | A1* | 1/2020 | Jung | G06F 3/0604 |

FOREIGN PATENT DOCUMENTS

| | | | | |
|---|---|---|---|---|
| CN | 108334275 | | 7/2018 | |
| CN | 108733510 | | 11/2018 | |
| CN | 111400201 A | * | 7/2020 | ......... G06F 12/0246 |

OTHER PUBLICATIONS

W. Tsai, S. Wu and L. Chang, "Learning-Assisted Write Latency Optimization for Mobile Storage," 2019 IEEE 25th International Conference on Embedded and Real-Time Computing Systems and Applications (RTCSA), 2019, pp. 1-6 (Year: 2019).*

B. Ravandi, I. Papapanagiotou and B. Yang, "A Black-Box Self-Learning Scheduler for Cloud Block Storage Systems," 2016 IEEE 9th International Conference on Cloud Computing (CLOUD), 2016, pp. 820-825 (Year: 2016).*

T. Roy, J. Gupta, K. Kant, A. Pal and D. Minturn, "PLMlight: Emulating Predictable Latency Mode in Regular SSDs," 2021 IEEE 20th International Symposium on Network Computing and Applications (NCA), 2021, pp. 1-8 (Year: 2021).*

"Office Action of Taiwan Counterpart Application", dated Nov. 9, 2020, p. 1-p. 8.

"Office Action of China Counterpart Application", dated Mar. 3, 2022, p. 1-p. 9.

* cited by examiner

DATA ARRANGEMENT METHOD OF FLASH MEMORY, FLASH MEMORY STORAGE DEVICE AND FLASH MEMORY CONTROL CIRCUIT UNIT

CROSS-REFERENCE TO RELATED APPLICATION

This application claims the priority benefit of China application serial no. 202010196343.5, filed on Mar. 19, 2020. The entirety of the above-mentioned patent application is hereby incorporated by reference herein and made a part of this specification.

BACKGROUND OF THE INVENTION

Field of the Invention

The invention relates to a memory management technique, and in particular, to a data arrangement method of a flash memory, a flash memory storage device, and a flash memory control circuit unit.

Description of Related Art

The growth of digital cameras, mobile phones, and MP3 players has been rapid in recent years. Consequently, the consumers' demand for storage media has increased tremendously. Since a rewritable non-volatile memory module (such as a flash memory) has characteristics such as data non-volatility, power-saving, small size, fast access, and no mechanical structures, the rewritable non-volatile memory module is suitable to be built into the various portable multimedia devices provided above. Therefore, the flash memory industry has become a relatively important part in the electronic industry in recent years.

The flash memory-based memory storage device may not overwrite existing stored data, but needs to release physical erasing units for the stored data via a garbage collection operation. Generally, during the garbage collection process, a plurality of physical erasing units are first selected as source physical erasing units, and one physical erasing unit is selected as a target physical erasing unit. Then a valid data in the source physical erasing units is transferred (or copied) to the target physical erasing unit, and the source physical erasing units are erased to free up the space occupied by an invalid data in the source physical erasing units. However, every write command of a host is garbage collected before the target physical erasing unit is turned off (that is, configured so that data may no longer be written). In this way, during garbage collection, the operating efficiency of the write command of the host when the flash memory storage device is in a dirty state is affected, thereby causing a delay in the flash memory storage device. Therefore, how to reduce the delay caused by the execution of the garbage collection operation so as to improve the operation efficiency of the flash memory storage device is an issue of concern to those skilled in the art.

SUMMARY OF THE INVENTION

The invention provides a data arrangement method of a flash memory, a flash memory storage device, and a flash memory control circuit unit. Source physical erasing units of a garbage collection operation may be dynamically selected and a time of executing the garbage collection operation may be dynamically managed to improve the execution efficiency of a write command.

An exemplary embodiment of the invention provides a data arrangement method of a flash memory configured for a memory storage device including a rewritable non-volatile memory module, and the data arrangement method of the flash memory includes the following steps. A background garbage collection operation is executed in a background mode. At least one write command is received from a host when the background garbage collection operation is not completed to suspend the background garbage collection operation and exit the background mode. The write command is executed. The background mode is entered and the execution of the background garbage collection operation is continued after the execution of the at least one write command is completed.

In an embodiment of the invention, the method further includes the following steps. A valid data of one or a plurality of source physical erasing units is copied to a target physical erasing unit when the background garbage collection operation is executed. The one or a plurality of source physical erasing units are erased and the one or a plurality of source physical erasing units are released as free physical erasing units. The valid data of the one or a plurality of source physical erasing units is suspended from being copied to the target physical erasing unit when the background garbage collection operation is suspended, and the target physical erasing unit is retained and a foreground mode is entered from the background mode to execute the at least one write command.

In an embodiment of the invention, the step of executing the background garbage collection operation in the background mode includes the following steps. One or a plurality of the physical erasing units are selected as the one or a plurality of source physical erasing units according to a valid count corresponding to a plurality of physical erasing units, and the valid data of the one or a plurality of source physical erasing units is copied to the target physical erasing unit.

In an embodiment of the invention, the step of executing the at least one write command includes the following steps. One or a plurality of the physical erasing units are selected as the one or a plurality of source physical erasing units according to a latest valid count corresponding to the physical erasing units in a case that a foreground garbage collection operation is executed during the execution of the at least one write command, and the valid data of the one or a plurality of source physical erasing units is copied to the target physical erasing unit.

In an embodiment of the invention, the background garbage collection operation and the foreground garbage collection operation share the same target physical erasing unit.

In an embodiment of the invention, a first activation threshold for determining the execution of the background garbage collection operation is greater than a second activation threshold for determining the execution of the foreground garbage collection operation.

In an embodiment of the invention, the step of entering the background mode and continuing to execute the background garbage collection operation after the execution of the at least one write command is completed further includes the following steps. The background mode is entered after a predetermined time after the execution of the at least one write command is completed. The background garbage collection operation is executed according to the latest valid count corresponding to the physical erasing units, one or a plurality of the physical erasing units are selected as the one or a plurality of source physical erasing units, and the valid data of the one or a plurality of source physical erasing units is copied to the target physical erasing unit.

An exemplary embodiment of the invention provides a flash memory storage device including a connection interface unit, a rewritable non-volatile memory module, and a flash memory control circuit unit. The connection interface unit is configured to be coupled to a host. The flash memory control circuit unit is coupled to the connection interface unit and the rewritable non-volatile memory module, wherein the flash memory control circuit unit is configured to execute a background garbage collection operation in a background mode. The flash memory control circuit unit is further configured to receive at least one write command from the host when the background garbage collection operation is not completed to suspend the background garbage collection operation and exit the background mode. The flash memory control circuit unit is further configured to execute the at least one write command. Moreover, the flash memory control circuit unit is further configured to enter the background mode and continue the execution of the background garbage collection operation after the execution of the at least one write command is completed.

In an embodiment of the invention, the flash memory control circuit unit is further configured to copy a valid data of one or a plurality of source physical erasing units to a target physical erasing unit when the background garbage collection operation is executed. The flash memory control circuit unit is further configured to erase the one or a plurality of source physical erasing units and release the one or a plurality of source physical erasing units as free physical erasing units. Moreover, the flash memory control circuit unit is further configured to suspend the valid data of the one or a plurality of source physical erasing units from being copied to the target physical erasing unit when the background garbage collection operation is suspended, retain the target physical erasing unit, and enter a foreground mode from the background mode to execute the at least one write command.

In an embodiment of the invention, in the operation of executing the background garbage collection operation in the background mode, the flash memory control circuit unit is further configured to select one or a plurality of the physical erasing units as the one or a plurality of source physical erasing units according to a valid count corresponding to a plurality of physical erasing units, and copy the valid data of the one or a plurality of source physical erasing units to the target physical erasing unit.

In an embodiment of the invention, in the operation of executing the at least one write command, the flash memory control circuit unit is further configured to select one or a plurality of the physical erasing units as the one or a plurality of source physical erasing units according to a latest valid count corresponding to the physical erasing units in a case that a foreground garbage collection operation is executed during the execution of the at least one write command, and copy the valid data of the one or a plurality of source physical erasing units to the target physical erasing unit.

In an embodiment of the invention, the background garbage collection operation and the foreground garbage collection operation share the same target physical erasing unit.

In an embodiment of the invention, a first activation threshold for determining the execution of the background garbage collection operation is greater than a second activation threshold for determining the execution of the foreground garbage collection operation.

In an embodiment of the invention, in the operation of entering the background mode and continuing to execute the background garbage collection operation after the execution of the at least one write command is completed, the flash memory control circuit unit is further configured to enter the background mode after a predetermined time after the execution of the at least one write command is completed. Moreover, the flash memory control circuit unit is further configured to execute the background garbage collection operation according to a latest valid count corresponding to the physical erasing units, select one or a plurality of the physical erasing units as the one or a plurality of source physical erasing units, and copy the valid data of the one or a plurality of source physical erasing units to the target physical erasing unit.

An exemplary embodiment of the invention provides a flash memory control circuit unit configured to control a flash memory storage device including a rewritable non-volatile memory module, and the flash memory control circuit unit includes a host interface, a memory interface, and a memory management circuit. The host interface is configured to be coupled to a host. The memory interface is configured to be coupled to the rewritable non-volatile memory module. The memory management circuit is coupled to the host interface and the memory interface. The flash memory control circuit unit is configured to execute a background garbage collection operation in a background mode. The flash memory control circuit unit is further configured to receive at least one write command from the host when the background garbage collection operation is not completed to suspend the background garbage collection operation and exit the background mode. The flash memory control circuit unit is further configured to execute the at least one write command. Moreover, the flash memory control circuit unit is further configured to enter the background mode and continue the execution of the background garbage collection operation after the execution of the at least one write command is completed.

In an embodiment of the invention, the flash memory control circuit unit is further configured to copy a valid data of one or a plurality of source physical erasing units to a target physical erasing unit when the background garbage collection operation is executed. The flash memory control circuit unit is further configured to erase the one or a plurality of source physical erasing units and release the one or a plurality of source physical erasing units as free physical erasing units. Moreover, the flash memory control circuit unit is further configured to suspend the valid data of the one or a plurality of source physical erasing units from being copied to the target physical erasing unit when the background garbage collection operation is suspended, retain the target physical erasing unit, and enter a foreground mode from the background mode to execute the at least one write command.

In an embodiment of the invention, in the operation of executing the background garbage collection operation in the background mode, the flash memory control circuit unit is further configured to select one or a plurality of the physical erasing units as the one or a plurality of source physical erasing units according to a valid count corresponding to a plurality of physical erasing units, and copy the valid data of the one or a plurality of source physical erasing units to the target physical erasing unit.

In an embodiment of the invention, in the operation of executing the at least one write command, the flash memory control circuit unit is further configured to select one or a plurality of the physical erasing units as the one or a plurality of source physical erasing units according to a latest valid count corresponding to the physical erasing units in a case that a foreground garbage collection operation is executed during the execution of the at least one write command, and copy the valid data of the one or a plurality of source physical erasing units to the target physical erasing unit.

In an embodiment of the invention, the background garbage collection operation and the foreground garbage collection operation share the same target physical erasing unit.

In an embodiment of the invention, a first activation threshold for determining the execution of the background garbage collection operation is greater than a second activation threshold for determining the execution of the foreground garbage collection operation.

In an embodiment of the invention, in the operation of entering the background mode and continuing to execute the background garbage collection operation after the execution of the at least one write command is completed, the flash memory control circuit unit is further configured to enter the background mode after a predetermined time after the execution of the at least one write command is completed. Moreover, the flash memory control circuit unit is further configured to execute the background garbage collection operation according to a latest valid count corresponding to the physical erasing units, select one or a plurality of the physical erasing units as the one or a plurality of source physical erasing units, and copy the valid data of the one or a plurality of source physical erasing units to the target physical erasing unit.

Based on the above, in the foreground garbage collection operation and the background garbage collection operation, the valid data of the source physical erasing units may be transferred (or copied) to the same target physical erasing unit. Moreover, in the foreground mode, when the number of the free physical erasing units of the rewritable non-volatile memory module is not greater than the activation threshold, a plurality of source physical erasing units are selected according to the valid count corresponding to the plurality of physical erasing units to execute the garbage collection operation. In addition, when the number of the free physical erasing units of the rewritable non-volatile memory module is greater than the activation threshold, a write command is executed. In other words, by dynamically selecting the source physical erasing units of the garbage collection operation and dynamically managing the time of executing the garbage collection operation, the execution efficiency of the write command may be effectively improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In general, a memory storage device (also referred to as a memory storage system) includes a rewritable non-volatile memory module and a controller (also referred to as a control circuit unit). The memory storage device is generally used with a host, such that the host may write data into the memory storage device or read data from the memory storage device.

Figure 1:
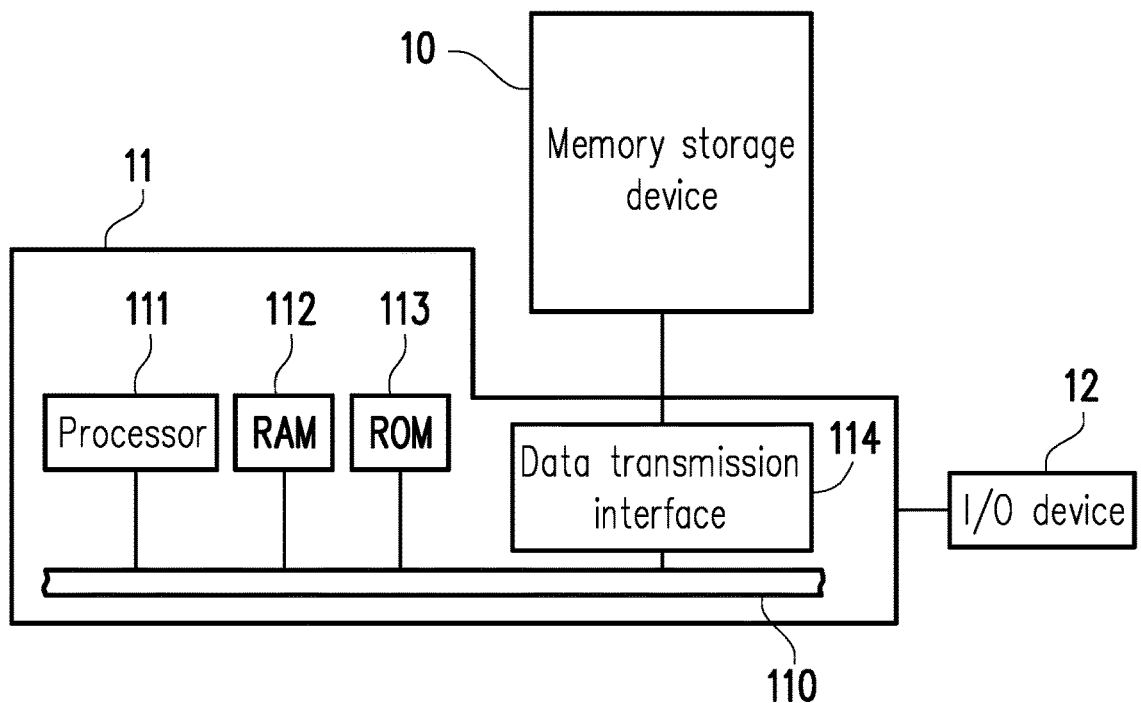
FIG. 1 is a diagram of a host, a memory storage device, and an input/output (I/O) device shown according to an exemplary embodiment.

FIG. 1 is a diagram of a host, a memory storage device, and an input/output (I/O) device shown according to an exemplary embodiment. Moreover, FIG. 2 is a diagram of a host, a memory storage device, and an input/output (I/O) device shown according to another exemplary embodiment.

Figure 2:
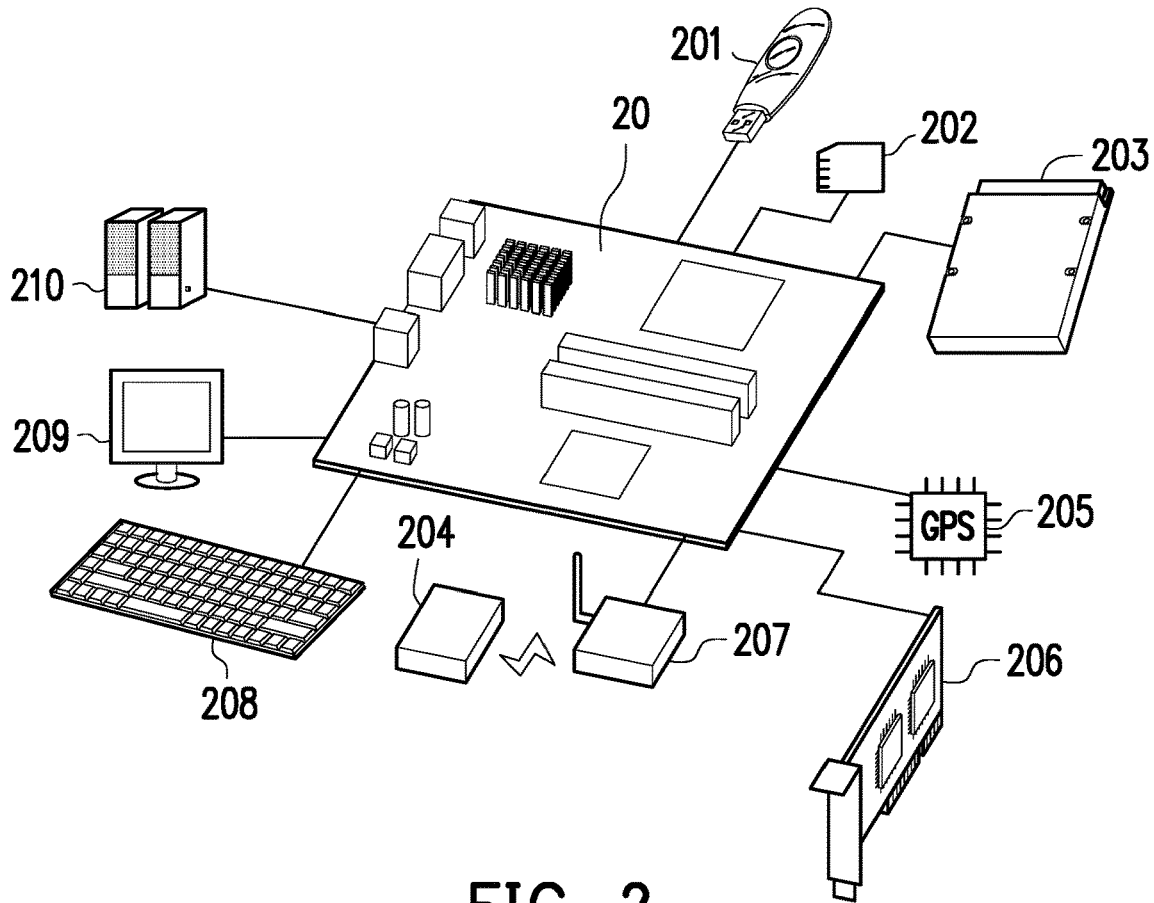
FIG. 2 is a diagram of a host, a memory storage device, and an input/output (I/O) device shown according to another exemplary embodiment.

Referring to FIG. 1 and FIG. 2, a host 11 generally includes a processor 111, a random-access memory (RAM) 112, a read-only memory (ROM) 113, and a data transmission interface 114. The processor 111, the RAM 112, the ROM 113, and the data transmission interface 114 are all coupled to a system bus 110.

In the present exemplary embodiment, the host 11 is coupled to the memory storage device 10 via the data transmission interface 114. For example, the host 11 may write data into the memory storage device 10 via the data transmission interface 114 or read data from the memory storage device 10. Moreover, the host 11 is coupled to the I/O device 12 via the system bus 110. For example, the host 11 may send an output signal to the I/O device 12 or receive an input signal from the I/O device 12 via the system bus 110.

In the present exemplary embodiment, the processor 111, the RAM 112, the ROM 113, and the data transmission interface 114 may be disposed on a motherboard 20 of the host 11. The quantity of the data transmission interface 114 may be one or a plurality. The motherboard 20 may be coupled to the memory storage device 10 in a wired or wireless method via the data transmission interface 114. The memory storage device 10 may be, for example, a flash drive 201, a memory card 202, a solid-state drive (SSD) 203, or a wireless memory storage device 204. The wireless memory storage device 204 may be, for example, a memory storage device based on various wireless communication techniques such as a near-field communication (NFC) memory storage device, a wireless fax (WiFi) memory storage device, a Bluetooth memory storage device, or a low-power Bluetooth memory storage device (such as iBeacon). Moreover, the motherboard 20 may also be coupled to various I/O devices such as a global positioning system (GPS) module 205, a network interface card 206, a wireless transmission device 207, a keyboard 208, a screen 209, or a speaker 210 via the system bus 110. For example, in an exemplary embodiment, the motherboard 20 may access the wireless memory storage device 204 via the wireless transmission device 207.

Figure 3:
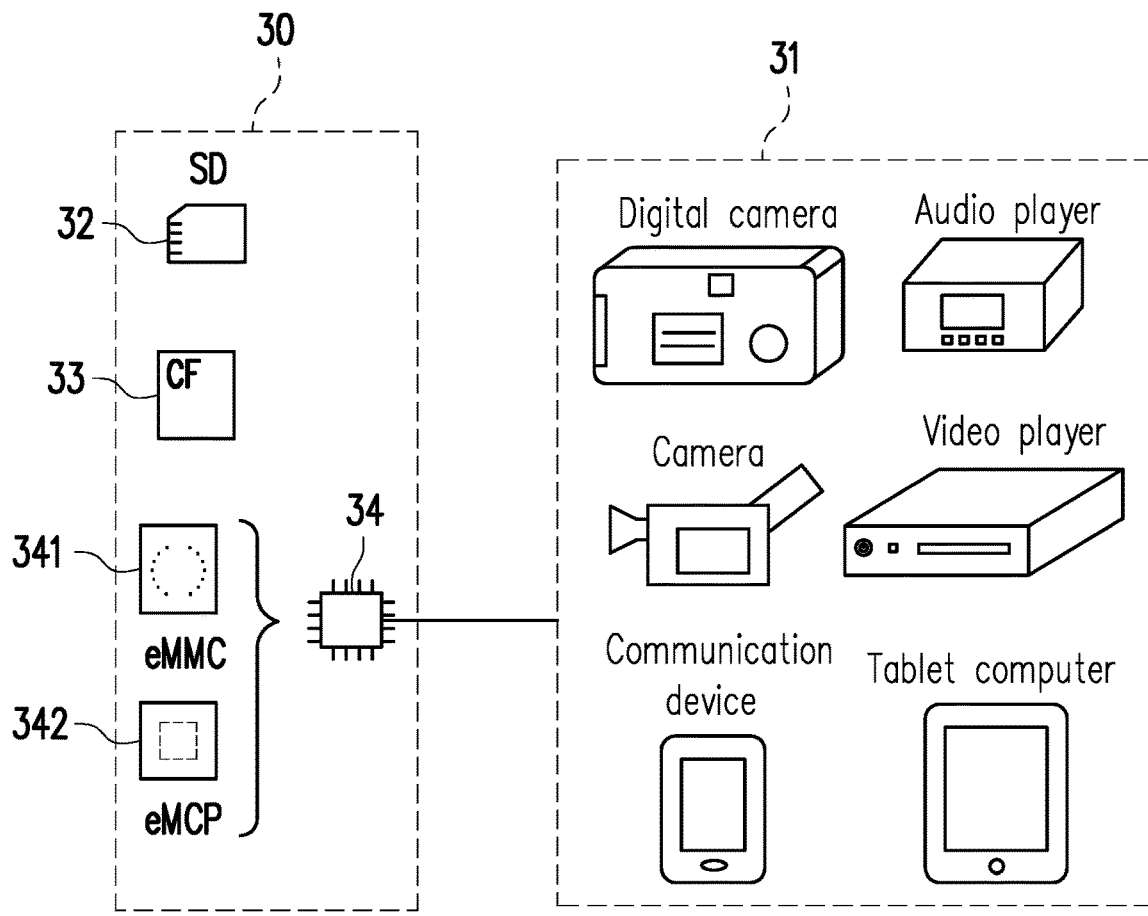
FIG. 3 is a diagram of a host and a memory storage device shown according to another exemplary embodiment.

In an exemplary embodiment, the host is any system that may substantially store data with the memory storage device. Although in the above exemplary embodiment, the host is exemplified by a computer system, FIG. 3 is a diagram of a host and a memory storage device shown according to another exemplary embodiment. Referring to FIG. 3, in another exemplary embodiment, the host 31 may also be a system such as a digital camera, a video camera, a communication device, an audio player, a video player, or a tablet computer, and the memory storage device 30 may be various non-volatile memory storage devices used thereby such as an SD card 32, a CF card 33, or an embedded storage device 34. The embedded storage device 34 includes various types of embedded storage devices for which a memory module is directly coupled on a substrate of the host, such as an embedded multimedia card (eMMC) 341 and/or an embedded multi-chip package (eMCP) storage device 342.

Figure 4:
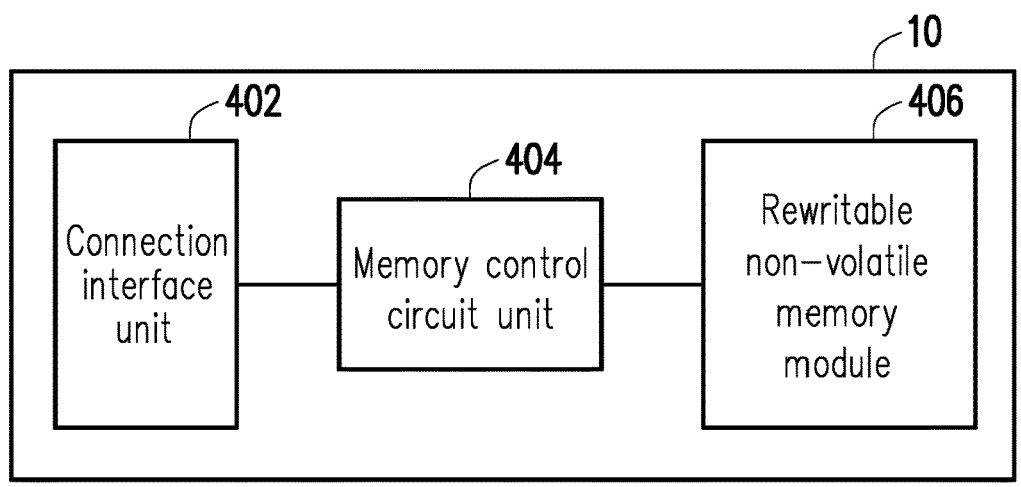
FIG. 4 is a schematic block diagram of a memory storage device shown according to an exemplary embodiment of the invention.

FIG. 4 is a schematic block diagram of a memory storage device shown according to an exemplary embodiment of the invention. Referring to FIG. 4, the memory storage device 10 (in the present embodiment, a flash memory storage device) includes a connection interface unit 402, a memory control circuit unit 404 (in the present embodiment, a flash memory control circuit unit), and a rewritable non-volatile memory module 406.

The connection interface unit 402 is configured to couple the memory storage device 10 to the host 11. The memory storage device 10 may communicate with the host 11 via the connection interface unit 402. In the present exemplary embodiment, the connection interface unit 402 is compatible with the serial advanced technology attachment (SATA) standard. However, it should be understood that the invention is not limited thereto, and the connection interface unit 402 may also comply with the Parallel Advanced Technology Attachment (PATA) standard, Institute of Electrical and Electronic Engineers (IEEE) 1394 standard, Peripheral Component Interconnect Express (PCI Express) standard, Universal Serial Bus (USB) standard, SD interface standard, Ultra High Speed-I (UHS-I) interface standard, Ultra High Speed-II (UHS-II) interface standard, Memory Stick (MS) interface standard, MCP interface standard, MMC interface standard, eMMC interface standard, Universal Flash Storage (UFS) interface standard, eMCP interface standard, CF interface standard, Integrated Device Electronics (IDE) standard, or other suitable standards. The connection interface unit 402 may be sealed in a chip with the memory control circuit unit 404. Alternatively, the connection interface unit 402 is disposed outside of a chip containing the memory control circuit unit 404.

The memory control circuit unit 404 is configured to execute a plurality of logic gates or control commands implemented in a hardware form or in a firmware form. The memory control circuit unit 404 also performs operations such as writing, reading, and erasing data in the rewritable non-volatile memory storage module 406 according to the commands of the host 11.

The rewritable non-volatile memory module 406 is coupled to the memory control circuit unit 404 and configured to store data written by the host 11. The rewritable non-volatile memory module 406 may be a single-level cell (SLC) NAND-type flash memory module (that is, a flash memory module that may store 1 bit in one memory cell), a multi-level cell (MLC) NAND-type flash memory module (that is, a flash memory module that may store 2 bits in one memory cell), a triple-level cell (TLC) NAND-type flash memory module (that is, a flash memory module that may store 3 bits in one memory cell), a quad-level cell (QLC) NAND-type flash memory module (that is, a flash memory module that may store 4 bits in one memory cell), other flash memory modules, or other memory modules with the same characteristics.

Each of the memory cells in the rewritable non-volatile memory module 406 stores one or a plurality of bits via the change in voltage (also referred to as threshold voltage hereinafter). Specifically, a charge-trapping layer is disposed between the control gate and the channel of each of the memory cells. By applying a write voltage to the control gate, the number of electrons of the charge-trapping layer may be changed, and therefore the threshold voltage of the memory cells may be changed. This operation of changing the threshold voltage of the memory cells is also referred to as "writing data to the memory cells" or "programming the memory cells". As the threshold voltage is changed, each of the memory cells in the rewritable non-volatile memory module 406 has a plurality of storage statuses. Which storage status one memory cell belongs to may be determined via the application of a read voltage, so as to obtain one or a plurality of bits stored by the memory cell.

In the present exemplary embodiment, the memory cells of the rewritable non-volatile memory module 406 may form a plurality of physical programming units, and these physical programming units may form a plurality of physical erasing units. Specifically, the memory cells on the same word line may form one or a plurality of physical programming units. If each memory cell may store two or more bits, the physical programming units on the same word line may at least be classified into lower physical programming units and upper physical programming units. For example, the least significant bit (LSB) of a memory cell belongs to a lower physical programming unit, and the most significant bit (MSB) of a memory cell belongs to an upper physical programming unit. Generally, in an MLC NAND-type flash memory, the write speed of the lower physical programming units is greater than the write speed of the upper physical programming units, and/or the reliability of the lower physical programming units is greater than the reliability of the upper physical programming units.

In the present exemplary embodiment, the physical programming unit is the smallest unit of programming. That is, the physical programming unit is the smallest unit of data writing. For example, the physical programming unit may be a physical page or a physical sector. If the physical programming unit is a physical page, then the physical programming unit may include a data bit area and a redundant bit area. The data bit area contains a plurality of physical pages configured to store user data, and the redundant bit area is configured to store system data (for example, management data such as an error correction code (ECC)). In the present exemplary embodiment, the data bit area contains 32 physical pages, and the size of one physical sector is 512 bytes (B). However, in other exemplary embodiments, the data bit area may also contain 8, 16, or a greater or lesser number of physical pages, and the size of each of the physical pages may also be greater or smaller. Moreover, the physical erasing unit is the smallest unit of erasing. That is, each of the physical erasing units contains the smallest number of memory cells erased together. For example, the physical erasing unit is a physical block.

Figure 5:
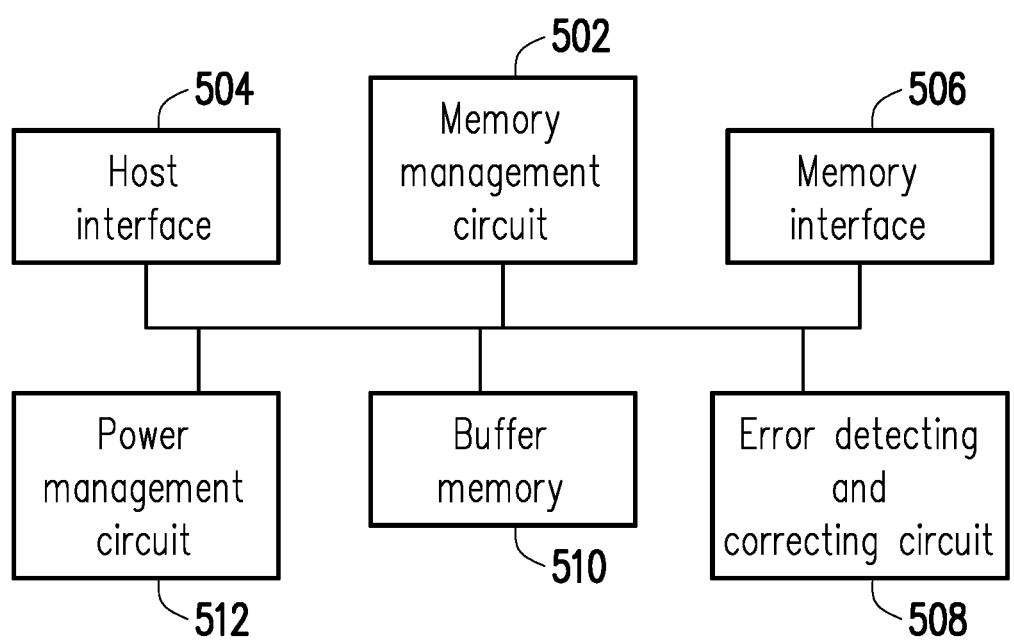
FIG. 5 is a schematic block diagram of a memory control circuit unit shown according to an exemplary embodiment of the invention.

FIG. 5 is a schematic block diagram of a memory control circuit unit shown according to an exemplary embodiment of the invention. Referring to FIG. 5, the memory control circuit unit 404 includes a memory management circuit 502, a host interface 504, and a memory interface 506.

The memory management circuit 502 is configured to control the overall operation of the memory control circuit unit 404. Specifically, the memory management circuit 502 has a plurality of control commands. During operation of the memory storage device 10, the control commands are executed to perform operations such as writing, reading, and erasing data. In the following, descriptions relating to the operation of the memory management circuit 502 are equivalent to the descriptions of the operation of the memory control circuit unit 404.

In the present exemplary embodiment, the control commands of the memory management circuit 502 are implemented in a firmware form. For example, the memory management circuit 502 has a microprocessor unit (not shown) and a read-only memory (not shown), and the control commands are burned into the ROM. During the operation of the memory storage device 10, the control commands are executed by the microprocessor unit to perform operations such as writing, reading, and erasing data.

In another exemplary embodiment, the control commands of the memory management circuit 502 may also be stored in the form of program codes in a specific area (for example, the system area in a memory module exclusively configured to store system data) of the rewritable non-volatile memory module 406. Moreover, the memory management circuit 502 has a microprocessor unit (not shown), a ROM (not shown), and a RAM (not shown). In particular, the ROM has a boot code, and when the memory control circuit unit 404 is enabled, the microprocessor unit first executes the boot code to load the control commands stored in the rewritable non-volatile memory module 406 into the RAM of the memory management circuit 502. Next, the microprocessor unit runs the control commands to perform operations such as writing, reading, and erasing data.

Further, in another exemplary embodiment, the control commands of the memory management circuit 502 may also be implemented in a hardware form. For example, the memory management circuit 502 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage the memory cells or memory cell groups of the rewritable non-volatile memory module 406. The memory write circuit is configured to issue a write command sequence to the rewritable non-volatile memory module 406 to write data into the rewritable non-volatile memory module 406. The memory read circuit is configured to issue a read command sequence to the rewritable non-volatile memory module 406 to read data from the rewritable non-volatile memory module 406. The memory erase circuit is configured to issue an erase command sequence to the rewritable non-volatile memory module 406 to erase data from the rewritable non-volatile memory module 406. The data processing circuit is configured to process data to be written into the rewritable non-volatile memory module 406 and data read from the rewritable non-volatile memory module 406. The write command sequence, the read command sequence, and the erase command sequence may independently include one or a plurality of program codes or command codes and be configured to instruct the rewritable non-volatile memory module 406 to execute corresponding operations such as writing, reading, and erasing. In an exemplary embodiment, the memory management circuit 502 may also issue other types of command sequences to the rewritable non-volatile memory module 406 to instruct the execution of corresponding operations.

The host interface 504 is coupled to the memory management circuit 502. The memory management circuit 502 may communicate with the host 11 via the host interface 504. The host interface 504 may be used to receive and identify commands and data sent by the host 11. For example, the commands and data sent by the host 11 may be sent to the memory management circuit 502 via the host interface 504. In addition, the memory management circuit 502 may send data to the host 11 via the host interface 504. In the present exemplary embodiment, the host interface 504 is compatible with the SATA standard. However, it should be understood that the invention is not limited thereto, and the host interface 504 may also be compatible with the PATA standard, IEEE 1394 standard, PCI Express standard, USB standard, SD standard, UHS-I standard, UHS-II standard, MS standard, MMC standard, eMMC standard, UFS standard, CF standard, IDE standard, or other suitable standards for data transmission.

The memory interface 506 is coupled to the memory management circuit 502 and is configured to access the rewritable non-volatile memory module 406. In other words, data to be written into the rewritable non-volatile memory module 406 is converted to a format acceptable to the rewritable non-volatile memory module 406 via the memory interface 506. Specifically, if the memory management circuit 502 is to access the rewritable non-volatile memory module 406, the memory interface 506 sends a corresponding command sequence. For example, the command sequence may include a write command sequence instructing data writing, a read command sequence instructing data reading, an erase command sequence instructing data erasing, and corresponding command sequences configured to instruct various memory operations (such as changing read voltage level or executing a garbage collection operation). The command sequences are generated by, for example, the memory management circuit 502 and are sent to the rewritable non-volatile memory module 406 via the memory interface 506. The command sequences may include one or a plurality of signals or data on a bus. The signals or data may include a command code or a program code. For example, in the read command sequence, information such as read identification code or memory address is included.

In an exemplary embodiment, the memory control circuit unit 404 further includes an error detecting and correcting circuit 508, a buffer memory 510, and a power management circuit 512.

The error detecting and correcting circuit 508 is coupled to the memory management circuit 502 and is configured to execute an error detecting and correcting operation to ensure the correctness of data. Specifically, when the memory management circuit 502 receives a write command from the host 11, the error detecting and correcting circuit 508 generates an ECC and/or an error detection code (EDC) for data corresponding to the write command, and the memory management circuit 502 writes the data corresponding to the write command and the corresponding ECC and/or EDC into the rewritable non-volatile memory module 406. Next, when reading data from the rewritable non-volatile memory module 406, the memory management circuit 502 reads the ECC and/or the EDC corresponding to the data at the same time, and the error detecting and correcting circuit 508 executes an error detecting and correcting operation on the read data based on the ECC and/or the EDC.

The buffer 510 is coupled to the memory management circuit 502 and is configured to temporarily store data and commands from the host 11 or data from the rewritable non-volatile memory module 406. The power management circuit 512 is coupled to the memory management circuit 502 and is configured to control the power of the memory storage device 10.

In an exemplary embodiment, the rewritable non-volatile memory module 406 of FIG. 4 is also referred to as a flash memory module, and the memory control circuit unit 404 is also referred to as a flash memory controller configured to control the flash memory module. In an exemplary embodiment, the memory management circuit 502 of FIG. 5 is also referred to as a flash memory management circuit.

Figure 6:
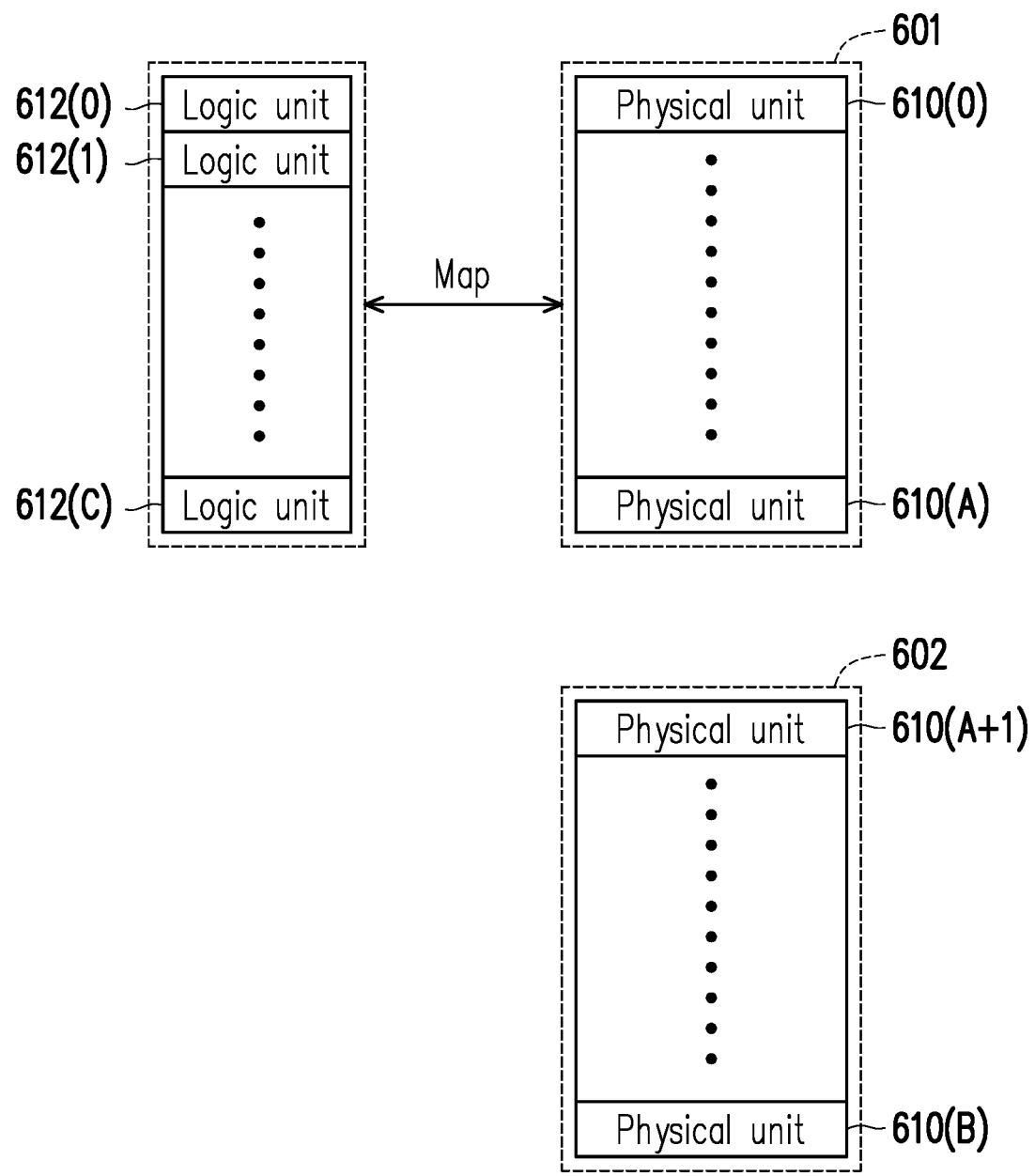
FIG. 6 is a diagram of the management of a rewritable non-volatile memory module shown according to an exemplary embodiment of the invention.

FIG. 6 is a schematic of the management of a rewritable non-volatile memory module shown according to an exemplary embodiment of the invention. Referring to FIG. 6, the memory management circuit 502 may logically group physical units 610(0) to 610(B) of the rewritable non-volatile memory module 406 into a storage area 601 and a replacement area 602. Physical units 610(0) to 610(A) in the storage area 601 are configured to store data, and physical units 610(A+1) to 610(B) in the replacement area 602 are configured to replace damaged physical units in the storage area 601. For example, if the data read from a certain physical unit contains too many errors that cannot be corrected, the physical unit is regarded as a damaged physical unit. It should be noted that if there is no physical erasing unit available in the replacement area 602, the memory management circuit 502 may declare the entire memory storage device 10 as a write protect state and data may no longer be written.

In the present exemplary embodiment, each physical unit refers to one physical erasing unit. However, in another exemplary embodiment, one physical unit may also refer to one physical address, one physical programming unit, or be formed by a plurality of continuous or discontinuous physical addresses. The memory management circuit 502 configures logic units 612(0) to 612(C) to map the physical units 610(0) to 610(A) in the storage area 601. In the present exemplary embodiment, each of the logic units refers to one logical address. However, in another exemplary embodiment, one logic unit may also refer to one logic programming unit, one logic erasing unit, or be formed by a plurality of continuous or discontinuous logical addresses. In addition, each of the logic units 612(0) to 612(C) may be mapped to one or a plurality of physical units.

The memory management circuit 502 may record the mapping relationship between the logic units and the physical units (also referred to as a logic-physical address mapping relationship) in at least one logic-physical address mapping table. When the host 11 is to read data from the memory storage device 10 or write data to the memory storage device 10, the memory management circuit 502 may execute a data access operation on the memory storage device 10 according to the logic-physical address mapping table.

It should be noted that, the description of the operation of the memory control circuit unit 404 below is equivalent to the description of the operation of the memory management circuit 502.

The data arrangement method of the flash memory provided in the present embodiment may be applied to a flash memory, an embedded memory device, or a solid-state hard disk having a three-dimensional (3D) structure, but the invention is not limited thereto.

In the present embodiment, the memory storage device 10 executes a background garbage collection operation in a background mode. If the memory storage device 10 receives a write command from the host 11 when executing the background garbage collection operation, the memory storage device 10 suspends the background garbage collection operation and exits the background mode and enters a foreground mode. Then, the memory storage device 10 receives a plurality of write commands from the host 11, enters the background mode and continues to execute the background garbage collection operation after completing the execution of the write commands. Specifically, when the memory storage device 10 receives a write command from the host 11, the memory control circuit unit 404 needs to immediately execute and respond to the host 11 to avoid timeout. Here, a mode in response to a program executed by the host 11 is referred to as the foreground mode. In contrast, the memory control circuit unit 404 may also be operated while idle (that is, no command sent from the host 11 is received). For example, a garbage collection operation and the like may be performed while idle. Here, a mode that is not in response to a program executed by the host 11 is referred to as the background mode. In the present embodiment, the memory storage device 10 enters the background mode from the foreground mode at idle time, and executes a garbage collection operation when the garbage collection conditions of the background mode are met.

The garbage collection conditions of the background mode may be, for example, the memory control circuit unit 404 determining whether the number of the free physical erasing units of the rewritable non-volatile memory module 406 is greater than the activation threshold of the background garbage collection operation. In addition, when the number of the free physical erasing units of the rewritable non-volatile memory module 406 is not greater than the activation threshold, the memory control circuit unit 404 executes the background garbage collection operation. When the background garbage collection operation is executed, the memory control circuit unit 404 transfers (or copies) a valid data of a plurality of source physical erasing units to a target physical erasing unit, erases the source physical erasing units, and releases the source physical erasing units as free physical erasing units. In addition, when the background garbage collection operation is suspended, the memory control circuit unit 404 suspends the valid data of the source physical erasing units from being transferred (or copied) to the target physical erasing unit, and retains the target physical erasing unit and enters the foreground mode from the background mode to execute a write command.

Generally speaking, if the number of the free physical erasing units is insufficient when the write command is executed in the foreground mode, the memory control circuit unit 404 executes the garbage collection operation after the execution of the write command is completed. However, the execution of other write commands must be stopped during the execution of the garbage collection operation, thus causing delays.

Therefore, in the data arrangement method of the flash memory provided in the present embodiment, after the memory control circuit unit 404 enters the foreground mode, whether the number of the free physical erasing units of the rewritable non-volatile memory module 406 is greater than the activation threshold of the foreground garbage collection operation may be determined. In addition, when the number of the free physical erasing units of the rewritable non-volatile memory module 406 is not greater than the activation threshold, the memory control circuit unit 404 executes the foreground garbage collection operation. In an embodiment, an activation threshold for determining the execution of the background garbage collection operation is greater than an activation threshold for determining the execution of the foreground garbage collection operation.

In an embodiment, when the memory control circuit unit 404 executes the background garbage collection operation in the background mode, the memory control circuit unit 404 selects a plurality of source physical erasing units to execute the garbage collection operation according to a valid count corresponding to the plurality of physical erasing units. Specifically, the memory control circuit unit 404 determines the arrangement order of each physical erasing unit according to the valid count corresponding to each physical erasing unit when the number of the free physical erasing units is not greater than the activation threshold. When the background garbage collection operation is executed, the memory control circuit unit 404 selects one or a plurality of the physical erasing units included in the rewritable non-volatile memory module 406 as the source physical erasing units according to the arrangement order, and transfers (or copies) the valid data of the source physical erasing units to the target physical erasing unit. If all the valid data stored in a certain source physical erasing unit is transferred (or copied), the memory control circuit unit 404 erases the source physical erasing unit and releases the erased source physical erasing unit as a free physical erasing unit. The memory control circuit unit 404 may increase the number of the free physical erasing units according to the number of released free physical erasing units.

In an exemplary embodiment, the arrangement order of each physical erasing unit is related to the amount of valid data in each physical erasing unit (represented by valid count here). Based on the valid count value, the physical erasing units used as the source physical erasing units when the background garbage collection operation is executed may be determined. In the present exemplary embodiment, the memory control circuit unit 404 arranges from the physical erasing units having small valid count values to the physical erasing units having large valid count values according to the valid count value corresponding to each physical erasing unit. In the present exemplary embodiment, the memory control circuit unit 404 starts from the physical erasing unit having the smallest valid count value, selects the physical erasing unit as the source physical erasing unit according to the arrangement order, and executes the garbage collection operation according to the selected source physical erasing unit.

In an embodiment, if the memory control circuit unit 404 determines that the number of the free physical erasing units of the rewritable non-volatile memory module 406 is not greater than the activation threshold of the foreground garbage collection operation when the write command is executed and the foreground garbage collection operation needs to be executed, the memory control circuit unit 404 updates the arrangement order of the physical erasing units according to the valid count values corresponding to the physical erasing units. Moreover, the memory control circuit unit 404 selects one or a plurality of the physical erasing units included in the rewritable non-volatile memory module 406 as the source physical erasing units according to the updated arrangement order, and transfers (or copies) the valid data of the source physical erasing units to the target physical erasing unit.

In an embodiment, the background garbage collection operation and the foreground garbage collection operation share the same target physical erasing unit. Specifically, in the present embodiment, when the foreground garbage collection operation is executed, the memory control circuit unit 404 transfers (or copies) the valid data of the source physical erasing units to the same target physical erasing unit as when the background garbage collection operation is executed. However, the invention is not limited thereto. In another embodiment, the background garbage collection operation and the foreground garbage collection operation may also have their own corresponding target physical erasing units.

In other words, since some write operations are executed before the foreground garbage collection operation is executed, the valid count of the physical erase units is changed. Therefore, in the data arrangement method of the flash memory provided in the present embodiment, when the memory control circuit unit 404 determines whether to execute a garbage collection operation in the foreground mode, the memory control circuit unit 404 may dynamically select the source physical erasing units of the garbage collection operation according to the valid count of the current physical erasing units, instead of selecting the source physical erasing units by executing the valid count of the physical erasing units when the background garbage collection is executed. Therefore, the object of releasing the most physical erasing units may be achieved.

In another embodiment, when the foreground garbage collection operation is executed, the erased source physical erasing units are released as free physical erasing units, and the memory control circuit unit 404 may increase the number of the free physical erasing units according to the number of released free physical erasing units. At this time, the number of the free physical erasing units is increased, and the memory control circuit unit 404 determines whether the number of the free physical erasing units is greater than the activation threshold. If the memory control circuit unit 404 determines that the number of the free physical erasing units is not greater than the activation threshold, it means that the number of the free physical erasing units in the rewritable non-volatile memory module 406 is still insufficient, and therefore the memory control circuit unit 404 continues to execute the foreground garbage collection operation. In contrast, if the memory control circuit unit 404 determines that the number of the free physical erasing units is greater than the activation threshold, then the memory control circuit unit 404 stops the execution of the foreground garbage collection operation and continues to execute the write command.

Moreover, when the number of the free physical erasing units is greater than the activation threshold, the memory control circuit unit 404 executes the write command. At this point, the memory storage device 10 continuously receives a plurality of write commands from the host 11, and the memory control circuit unit 404 writes the data corresponding to the write commands to the rewritable non-volatile memory module 406 when the write commands are executed, and therefore the number of the free physical erasing units is reduced. When the write commands are executed, the memory control circuit unit 404 may determine whether the number of the free physical erasing units is greater than the activation threshold. If the memory control circuit unit 404 determines that the number of the free physical erasing units is not greater than the activation threshold, the memory control circuit unit 404 redetermines the arrangement order of the source physical erasing units according to the valid count corresponding to the physical erasing units to execute the garbage collection operation according to the updated arrangement order. The specific method of the garbage collection operation is as described above and is not repeated herein.

In an embodiment, the memory control circuit unit 404 enters the background mode after a predetermined time after the execution of the write command is completed. Moreover, after entering the background mode, the memory control circuit unit 404 updates the arrangement order of the physical erasing units according to the value of the latest valid count corresponding to the physical erasing units, and selects one or a plurality of the physical erasing units included in the rewritable non-volatile memory module 406 according to the arrangement order as the source physical erasing units, and transfers (or copies) the valid data of the source physical erasing units to the target physical erasing units. Here, the memory control circuit unit 404 transfers (or copies) the valid data of the source physical erasing units to the same target physical erasing unit as when the background garbage collection operation is suspended.

It is noted that in the following description, some terms may be replaced with corresponding abbreviations for ease of reading (see Table 1).

TABLE 1

| rewritable non-volatile memory module | RNVM module |
| physical erasing unit | PEU |
| memory control circuit unit | MCCU |
| garbage collection operation | GCO |
| memory storage device | MSD |
| valid count | VC |

Figure 7:
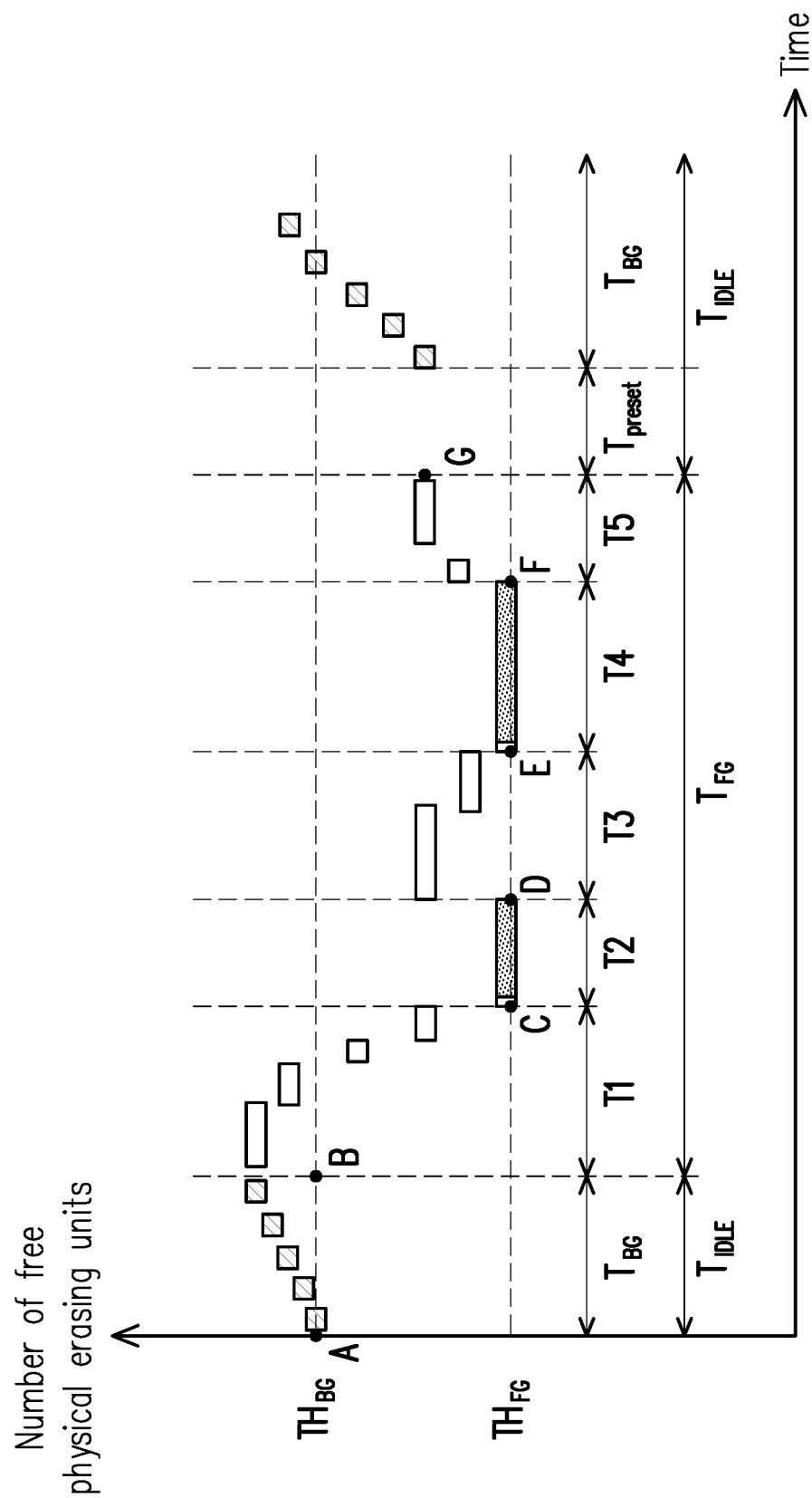
FIG. 7 is an example of a data arrangement method of a flash memory shown according to an exemplary embodiment of the invention.
Figure 8:
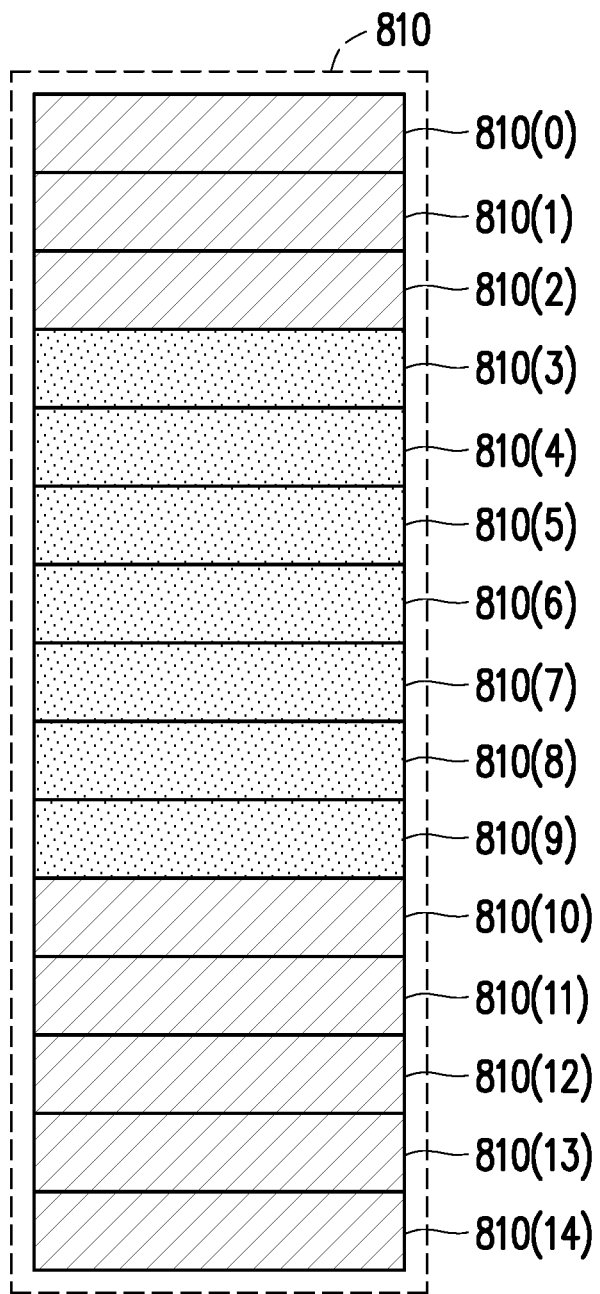
FIG. 8 is a diagram of a target physical erasing unit shown according to an exemplary embodiment of the invention.

FIG. 7 is an example of a data arrangement method of a flash memory shown according to an exemplary embodiment of the invention. FIG. 8 is a diagram of a target PEU shown according to an exemplary embodiment of the invention. Referring to FIG. 7, in the present exemplary embodiment, the execution time of the MCCU 404 is categorized into an idle time $T_{IDLE}$ and a foreground operation time $T_{FG}$. The MCCU 404 enters a background mode during the idle time $T_{IDLE}$. In the background mode, the MCCU 404 may perform a data transfer (or copy) operation. For example, in the present exemplary embodiment, the MCCU 404 executes a GCO when the garbage collection conditions of the background mode are met. Specifically, the MCCU 404 enters a background garbage collection time $T_{BG}$ from the idle time $T_{IDLE}$ between a time point A and a time point B and executes a background GCO. The MCCU 404 arranges from the PEUs having small VC values to the PEUs having large VC values according to the VC value corresponding to each PEU included in the RNVM module 406. The MCCU 404 starts from the PEU having the smallest VC value, selects the PEU as the source PEU according to the arrangement order, and simultaneously selects one PEU as the target PEU (for example, a PEU 810 in FIG. 8). In the present embodiment, the MCCU 404 selects, for example, five PEUs from the PEUs as the source PEUs. Then, the MCCU 404 executes the GCO according to the selected source PEUs, and transfers (or copies) the valid data of the selected five source PEUs to the target PEU 810. The MCCU 404 erases the source PEUs and releases the erased source PEU as free PEUs, and increases the number of the released free PEUs according to the number of the released free PEUs. However, the MCCU 404 may receive a write command from the host 11 when the background GCO is not completed, such as the time point B in FIG. 7.

At the time point B, the host 11 sends a plurality of write commands, and the MSD 10 receives a plurality of write commands from the host 11 and enters the foreground operation time $T_{FG}$ from the idle time $T_{IDLE}$, that is, exits the background mode and enters a foreground mode to process the write commands. At this time, the MCCU 404 suspends the background GCO and enters the foreground mode from the background mode. In the present embodiment, since the background GCO is suspended, the data in the five source PEUs selected during the background garbage collection may not all be transferred (or copied) to the target PEU. Referring to FIG. 8, the MCCU 404 only finishes transferring (or copying) the data of three of the source PEUs to sub-PEUs 810(0) to 810(2) of the target PEU, and the MCCU 404 retains the target PEU 810 and enters the foreground mode. In the foreground mode, the MCCU 404 determines whether the number of the free PEUs of the RNVM module 406 is greater than an activation threshold $TH_{FG}$. In other words, the MCCU 404 determines whether the number of the free PEUs meets conditions for executing a GCO in the foreground mode. In the present exemplary embodiment, the number of the free PEUs at the time point B does not meet the conditions for executing a GCO in the foreground mode (that is, the number of the free PEUs is greater than the activation threshold $TH_{FG}$), and the MCCU 404 executes a write command and does not execute a GCO.

Next, the MSD 10 continuously receives a plurality of write commands from the host 11 from the time point B to a time point C (that is, a time interval T1), and the MCCU 404 writes the data corresponding to the write commands to the RNVM module 406 when the write commands are executed, and therefore the number of the free PEUs is reduced. When the write commands are executed, the MCCU 404 may continuously determine whether the number of the free PEUs is greater than the activation threshold $TH_{FG}$.

At the time point C, when the MCCU 404 determines that the number of the free PEUs meets the conditions for executing the GCO in the foreground mode (that is, the number of the free PEUs is not greater than the activation threshold $TH_{FG}$), one or a plurality of the PEUs is reselected as the source PEUs according to the VC corresponding to the PEUs to execute the GCO. Here, the reselected source PEUs may be different from the source PEUs previously (for example, the background mode) selected. Specifically, at the time point C, the MCCU 404 arranges from the PEUs having small VC values to the PEUs having large VC values according to the VC value corresponding to each PEU. The MCCU 404 starts from the PEU having the smallest VC value, selects the PEU as the source PEU according to the arrangement order, and simultaneously selects one PEU as the target PEU. In the present exemplary embodiment, the MCCU 404 executes the foreground GCO, and transfers (or copies) the valid data of the source PEUs to sub-PEUs 810(3) to 810(5) of the target PEU 801. The MCCU 404 erases the source PEUs and releases the erased source PEU as free PEUs, and increases the number of the free PEUs according to the number of the released free PEUs. In another embodiment, the MCCU 404 may select other target PEUs, and the invention is not limited thereto.

Then, the MCCU 404 executes the foreground GCO from the time point C to a time point D (that is, a time interval T2), and continuously releases the free PEUs, and therefore the number of the free PEUs is increased. When the GCO is executed, the MCCU 404 may continuously determine whether the number of the free PEUs is greater than the activation threshold $TH_{FG}$. At the time point D, the MCCU 404 determines that the number of the free PEUs does not meet the conditions for executing the GCO in the foreground mode (that is, the number of the free PEUs is greater than the activation threshold $TH_{FG}$), and the MCCU 404 executes a write command.

Related content of the time point D to a time point E (that is, a time interval T3) and a time point F to a time point G (that is, a time interval T5) is provided in the implementation content of the time point B to the time point C, and related content of the time point E to the time point F (that is, a time interval T4) is provided in the implementation content of the time point C to the time point D, and details are not repeated herein. From the time point E to the time point F, the MCCU 404 reselects the source PEUs to execute the foreground GCO, and may transfer (or copy) the valid data of the source PEUs to sub-PEUs 810(6) to 810(9) of the target PEU 801. In another embodiment, the MCCU 404 may select other target PEUs, and the invention is not limited thereto.

Then, at the time point G, the MSD 10 no longer receives the write command from the host 11, and therefore the MCCU 404 enters the idle time $T_{IDLE}$ from the foreground operation time $T_{FG}$, that is, exits the foreground mode and enters the background mode. Related content of the background mode is provided in the implementation content of the time point A to the time point B and is not repeated herein. At the time point G, the MCCU 404 may wait a preset time $T_{preset}$, and enter the background garbage collection time $T_{BG}$ and execute a background GCO after the preset time $T_{preset}$, and may reselect the source PEUs to transfer (or copy) the valid data of the source PEUs to sub-PEUs 810(10) to 810(14) of the target PEU 801. In another embodiment, the MCCU 404 may select other target PEUs, and the invention is not limited thereto. Lastly, the MCCU 404 turns off the target PEU to complete the GCO.

Figure 9:
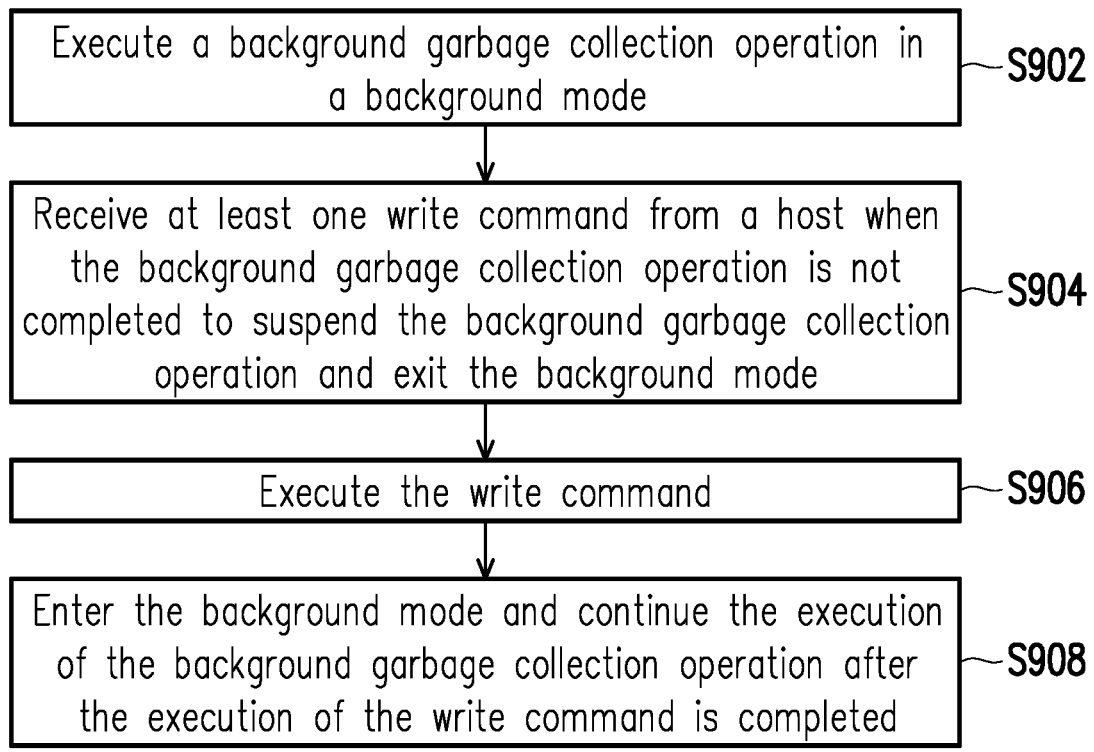
FIG. 9 is a flowchart of a data arrangement method of a flash memory shown according to an exemplary embodiment of the invention.

FIG. 9 is a flowchart of a data arrangement method of a flash memory shown according to an exemplary embodiment of the invention. In step S902, a background GCO is executed in a background mode. In step S904, at least one write command is received from a host when the background GCO is not completed to suspend the background GCO and exit the background mode. In step S906, the write command is executed. In step S908, the background mode is entered and the execution of the background GCO is continued after the execution of the write command is completed.

Figure 10:
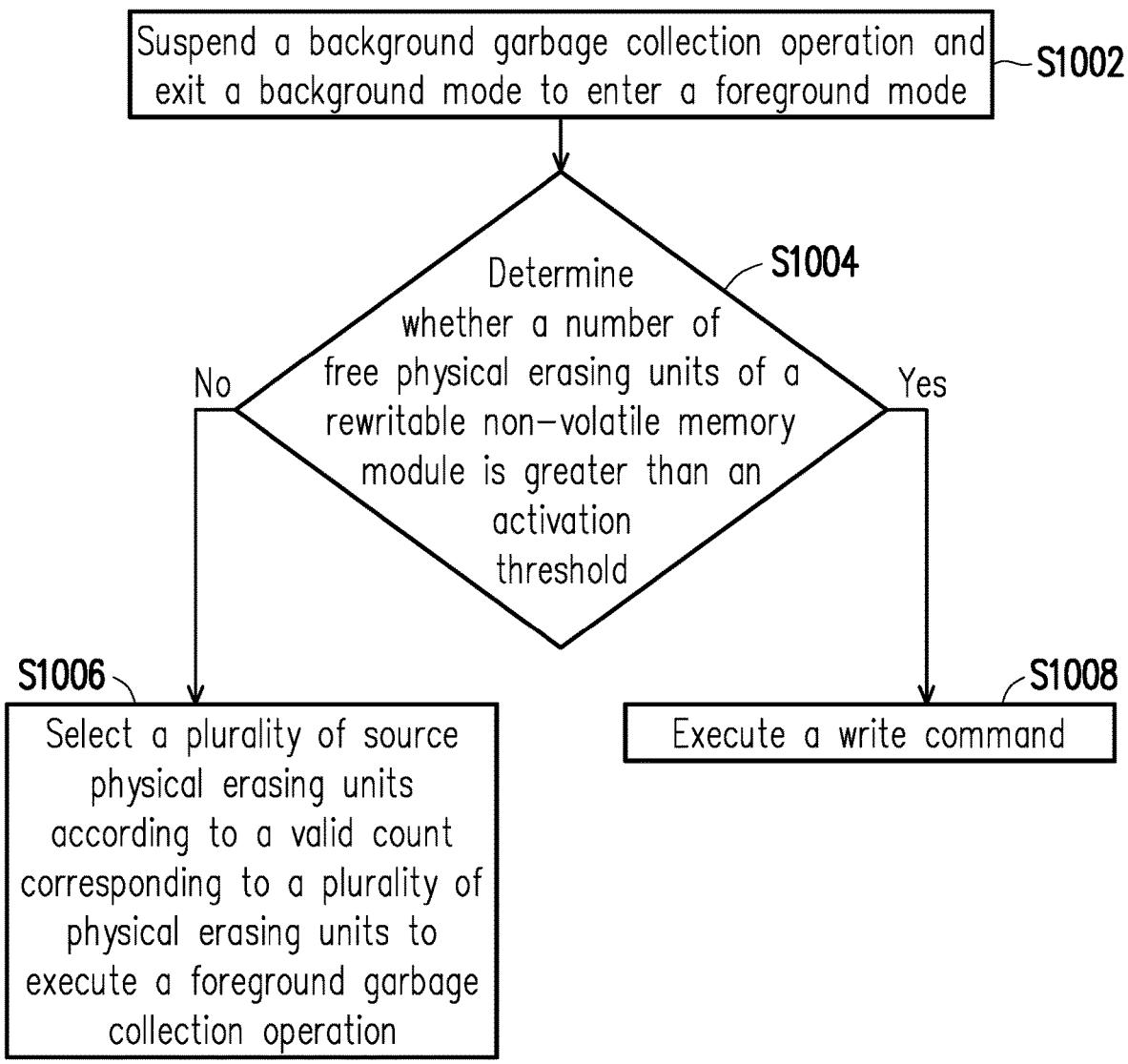
FIG. 10 is a flowchart of a data arrangement method of a flash memory shown according to an exemplary embodiment of the invention.

FIG. 10 is a flowchart of a data arrangement method of a flash memory shown according to an exemplary embodiment of the invention. Referring to FIG. 10, in step S1002, a background GCO is suspended and a background mode is exited to enter a foreground mode. In step S1004, whether a number of free PEUs of a RNVM module is greater than an activation threshold is determined. When the number of the free PEUs of the RNVM module is not greater than the activation threshold (step S1004, determined as no), a plurality of source PEUs are selected according to a VC corresponding to a plurality of PEUs to execute a foreground GCO (step S1006). When the number of the free PEUs of the RNVM module is greater than the activation threshold (step S1004, determined as yes), a write command is executed (step S1008).

Then, each step in FIG. 9 and FIG. 10 is as described in detail above, and is not repeated herein. It should be mentioned that, each step in FIG. 9 and FIG. 10 may be implemented as a plurality of program codes or circuits, and the invention is not limited thereto. Moreover, the method of FIG. 9 and FIG. 10 may be used with the above exemplary embodiments, and may also be used alone, and the invention is not limited thereto.

Based on the above, in the data arrangement method of the flash memory, the flash MSD, and the flash MCCU provided by the invention, when responding to a write command from the host, whether the GCO may wait is determined according to the status dynamics of the current free PEUs. When it is observed that the current number of the free PEUs exceeds the activation threshold, the flash MCCU puts the current GCO in a pending state and executes a write command. In addition, the GCO is executed the next time the garbage collection conditions of the foreground mode are met.

Based on the above, in the invention, in the foreground GCO and the background GCO, the valid data of the source PEUs may be transferred (or copied) to the same target PEU. Moreover, in the foreground mode, when the number of the free PEUs of the RNVM module is not greater than the activation threshold, a plurality of source PEUs are selected according to the VC corresponding to the plurality of PEUs to execute the GCO. In addition, when the number of the free PEUs of the RNVM module is greater than the activation threshold, a write command is executed. As a result, in the invention, by dynamically selecting the source PEUs of the GCO and dynamically managing the time of executing the GCO, the probability of executing a GCO in the foreground mode may be reduced, and the GCO may be executed in the background mode as much as possible. Moreover, by dynamically selecting the source PEUs of the GCO, the free PEUs may be quickly released. Accordingly, the delay caused by the GCO may be reduced to effectively improve the execution efficiency of the write command.

What is claimed is:

1. A data arrangement method of a flash memory configured for a flash memory storage device comprising a rewritable non-volatile memory module, and the data arrangement method of the flash memory comprises:

executing a background garbage collection operation in a background mode, wherein the step of executing the background garbage collection operation in the background mode comprises:
selecting one or a plurality of physical erasing units as one or a plurality of first source physical erasing units according to a valid count corresponding to the plurality of physical erasing units; and
copying a valid data of the one or a plurality of first source physical erasing units to a target physical erasing unit;

immediately after receiving at least one write command from a host at a time when the background garbage collection operation has not completed execution, suspending the background garbage collection operation, retaining the target physical erasing unit and exiting the background mode, wherein retaining the target physical erasing unit comprises keeping the target physical erasing unit configured for storing the valid data;

executing the at least one write command after exiting the background mode, selecting one or a plurality of the physical erasing units as one or a plurality of second source physical erasing units according to a latest valid count corresponding to the physical erasing units in a case that a foreground garbage collection operation is executed during the execution of the at least one write command, and copying a valid data of the one or a plurality of second source physical erasing units to the retained target physical erasing unit; and entering the background mode and continuing the execution of the background garbage collection operation after the execution of the at least one write command is completed.

2. The data arrangement method of the flash memory of claim further comprising:

after copying the valid data of the one or a plurality of first source physical erasing units to the target physical erasing unit when the background garbage collection operation is executed, erasing the one or a plurality of first source physical erasing units and releasing the one or a plurality of first source physical erasing units as free physical erasing units; and suspending the valid data of the one or a plurality of first source physical erasing units from being copied to the target physical erasing unit and entering a foreground mode from the background mode when the background garbage collection operation is suspended to execute the at least one write command.

3. The data arrangement method of the flash memory of claim 1, wherein the background garbage collection operation and the foreground garbage collection operation share the same target physical erasing unit.

4. The data arrangement method of the flash memory of claim 1, wherein a first activation threshold for determining that the background garbage collection operation is executed is greater than a second activation threshold for determining that the foreground garbage collection operation is executed.

5. The data arrangement method of the flash memory of claim 1, wherein the step of entering the background mode and continuing the execution of the background garbage collection operation after the execution of the at least one write command is completed further comprises:

entering the background mode after a predetermined time after the execution of the at least one write command is completed;

executing the background garbage collection operation according to the latest valid count corresponding to the physical erasing units, selecting one or a plurality of the physical erasing units as one or a plurality of third source physical erasing units, and copying a valid data of the one or a plurality of third source physical erasing units to the retained target physical erasing unit.

6. A flash memory storage device, comprising:
a connection interface unit configured to be coupled to a host;
a rewritable non-volatile memory module; and
a flash memory control circuit unit coupled to the connection interface unit and the rewritable non-volatile memory module,
wherein the flash memory control circuit unit is configured to execute a background garbage collection operation in a background mode, wherein the operation of executing the background garbage collection operation in the background mode comprises:
selecting one or a plurality of physical erasing units as one or a plurality of first source physical erasing units according to a valid count corresponding to the plurality of physical erasing units; and
copying a valid data of the one or a plurality of first source physical erasing units to a target physical erasing unit,
the flash memory control circuit unit is further configured to, immediately after receiving at least one write command from the host at a time when the background garbage collection operation has not completed execution, suspend the background garbage collection operation, retain the target physical erasing unit and exit the background mode, wherein retaining the target physical erasing unit comprises keeping the target physical erasing unit configured for storing the valid data,
the flash memory control circuit unit is further configured to execute the at least one write command after exiting the background mode,
the flash memory control circuit unit is further configured to select one or a plurality of the physical erasing units as one or a plurality of second source physical erasing units according to a latest valid count corresponding to the physical erasing units in a case that a foreground garbage collection operation is executed during the execution of the at least one write command, and copy a valid data of the one or a plurality of second source physical erasing units to the retained target physical erasing unit, and
the flash memory control circuit unit is further configured to enter the background mode and continue the execution of the background garbage collection operation after the execution of the at least one write command is completed.

7. The flash memory storage device of claim 6, wherein the flash memory control circuit unit is further configured to, after copying the valid data of the one or a plurality of first source physical erasing units to the target physical erasing unit when the background garbage collection operation is executed, erase the one or a plurality of first source physical erasing units and release the one or a plurality of first source physical erasing units as free physical erasing units, and
the flash memory control circuit unit is further configured to suspend the valid data of the one or a plurality of first source physical erasing units from being copied to the target physical erasing unit and enter a foreground mode from the background mode when the background garbage collection operation is suspended to execute the at least one write command.

8. The flash memory storage device of claim 7, wherein the background garbage collection operation and the foreground garbage collection operation share the same target physical erasing unit.

9. The flash memory storage device of claim 7, wherein a first activation threshold for determining that the background garbage collection operation is executed is greater than a second activation threshold for determining that the foreground garbage collection operation is executed.

10. The flash memory storage device of claim 7, wherein in the operation of entering the background mode and continuing the execution of the background garbage collection operation after the execution of the at least one write command is completed,
the flash memory control circuit unit is further configured to enter the background mode after a predetermined time after the execution of the at least one write command is completed, and
the flash memory control circuit unit is further configured to execute the background garbage collection operation according to the latest valid count corresponding to the physical erasing units, select one or a plurality of the physical erasing units as one or a plurality of third source physical erasing units, and copy a valid data of the one or a plurality of third source physical erasing units to the retained target physical erasing unit.

11. A flash memory control circuit unit configured to control a flash memory storage device comprising a rewritable non-volatile memory module, and the flash memory control circuit unit comprises:

a host interface configured to be coupled to a host;
a memory interface configured to be coupled to the rewritable non-volatile memory module; and
a memory management circuit coupled to the host interface and the memory interface,
wherein the flash memory control circuit unit is configured to execute a background garbage collection operation in a background mode, wherein the operation of executing the background garbage collection operation in the background mode comprises:
selecting one or a plurality of physical erasing units as one or a plurality of first source physical erasing units according to a valid count corresponding to the plurality of physical erasing units; and
copying a valid data of the one or a plurality of first source physical erasing units to a target physical erasing unit,
the flash memory control circuit unit is further configured to, immediately after receiving at least one write command from the host at a time when the background garbage collection operation has not completed execution, suspend the background garbage collection operation, retain the target physical erasing unit and exit the background mode, wherein retaining the target physical erasing unit comprises keeping the target physical erasing unit configured for storing the valid data,
the flash memory control circuit unit is further configured to execute the at least one write command after exiting the background mode,
the flash memory control circuit unit is further configured to select one or a plurality of the physical erasing units as one or a plurality of second source physical erasing units according to a latest valid count corresponding to the physical erasing units in a case that a foreground garbage collection operation is executed during the execution of the at least one write command, and copy a valid data of the one or a plurality of second source physical erasing units to the retained target physical erasing unit, and
the flash memory control circuit unit is further configured to enter the background mode and continue the execution of the background garbage collection operation after the execution of the at least one write command is completed.

12. The flash memory control circuit unit of claim 11, wherein the flash memory control circuit unit is further configured to, after copying the valid data of the one or a plurality of first source physical erasing units to the target physical erasing unit when the background garbage collection operation is executed, erase the one or a plurality of first source physical erasing units and release the one or a plurality of first source physical erasing units as free physical erasing units, and the flash memory control circuit unit is further configured to suspend the valid data of the one or a plurality of first source physical erasing units from being copied to the target physical erasing unit and enter a foreground mode from the background mode when the background garbage collection operation is suspended to execute the at least one write command.

13. The flash memory control circuit unit of claim 11, wherein the background garbage collection operation and the foreground garbage collection operation share the same target physical erasing unit.

14. The flash memory control circuit unit of claim 11, wherein a first activation threshold for determining that the background garbage collection operation is executed is greater than a second activation threshold for determining that the foreground garbage collection operation is executed.

15. The flash memory control circuit unit of claim 11, wherein in the operation of entering the background mode and continuing the execution of the background garbage collection operation after the execution of the at least one write command is completed, the flash memory control circuit unit is further configured to enter the background mode after a predetermined time after the execution of the at least one write command is completed, and
the flash memory control circuit unit is further configured to execute the background garbage collection operation according to the latest valid count corresponding to the physical erasing units, select one or a plurality of the physical erasing units as one or a plurality of third source physical erasing units, and copy a valid data of the one or a plurality of third source physical erasing units to the retained target physical erasing unit.

* * * * *